United States Patent [19]

Fuqua et al.

[11] Patent Number: 5,188,026
[45] Date of Patent: Feb. 23, 1993

[54] PIN REGISTER SYSTEM FOR SCREEN PRINTERS

[75] Inventors: Rick L. Fuqua, Chicago; Phil Motev, Deerfield, both of Ill.

[73] Assignee: Advance Process Supply Company, Chicago, Ill.

[21] Appl. No.: 770,518

[22] Filed: Oct. 3, 1991

[51] Int. Cl.⁵ .............................................. B41M 1/12
[52] U.S. Cl. .................................... 101/129; 101/126
[58] Field of Search ...................... 101/115, 126, 127.1, 101/128, 129, 485, 486; 430/22, 308

[56] References Cited

U.S. PATENT DOCUMENTS

| | | | |
|---|---|---|---|
| 3,427,964 | 2/1969 | Vasilantone | 101/126 |
| 4,315,461 | 2/1982 | Harpold | 101/115 |
| 4,463,673 | 8/1984 | Moore | 101/126 |
| 4,649,815 | 3/1987 | Richardson | 101/126 |
| 4,669,378 | 6/1987 | Lee | 101/126 |
| 4,723,487 | 2/1988 | Richardson | 101/126 |
| 4,735,139 | 4/1988 | Szarka | 101/126 |
| 4,738,909 | 4/1988 | Jennings | 430/22 |
| 4,819,559 | 4/1989 | Szarka | 101/126 |
| 4,846,058 | 7/1989 | Farris | 101/126 |
| 4,909,146 | 3/1990 | Szarka | 101/126 |
| 4,974,508 | 12/1990 | Andersen et al. | 101/115 |
| 5,090,313 | 2/1992 | Chapman | 101/129 |
| 5,094,161 | 3/1992 | Taylor | 101/115 |

OTHER PUBLICATIONS

TAS America, "Full Automatic Carousel Screen Printing Machine", Nov. 1, 1989, Advertisement Brochure.
M&R Printing Equipment, Inc., "Anything is Possible with Great Engineering", 1986, Advertisement Brochure.
Screen Printing Magazine, Precision Screen Machines, Inc., "Premiere 18", Dec. 1990, p. 29.
Screen Printing Magazine, Hix Corporation, "Quality by Design", Dec. 1990, p. 47.
Screen Printing Magazine, Alfra America, Inc., "A Long Stroke of Genius from Thieme", Dec. 1990, p. 55.
Screen Printing Magazine, Chaparral Industries, "The Proof is in the Production", Dec. 1990, p. 75.
Screen Printing Magazine, M&R Printing Equipment, Inc., "Names to Trust from M&R", Dec. 1990, p. 83.

Primary Examiner—Eugene H. Eickholt
Attorney, Agent, or Firm—Fitch, Even, Tabin & Flannery

[57] ABSTRACT

A registration apparatus and method is provided to accurately register film positive on screens held by screen frames and to likewise accurately register the screen frames within a printing apparatus with a registration system which reduces set-up time required for the printing machine without requiring an expensive automated registration system. An image positive is positioned on a vacuum table relative to a pair of registration pins or members which fit registration clamps on the screen frame. A plurality of pin tabs are secured on the vacuum table with their respective pins projecting through holes in the image positive. Each successive positive will be positioned on these pin tabs so that all successive positive have the same relationship between their respective image and the registration clamps of their associated screen frames. A calibration pallet is sequentially mounted on successive rotatable pallet arms and carries front and rear alignment holes already aligned with holes in alignment brackets on the front and rear portions of the screen holder. Pins are inserted through holes in the respective alignment brackets on the screen holder and holes in the calibration pallet at each of the respective printing stations. The alignment brackets on the screen holders are fixed in position, and the alignment pins are removed. With this alignment, the screen frames are each fastened in position at their respective screen holders by passing pins through the alignment brackets of the screen holder, through holes in the screen frame registration clamps, and into alignment holes of the calibration pallet to accurately align each of the screens relative to one another.

16 Claims, 8 Drawing Sheets

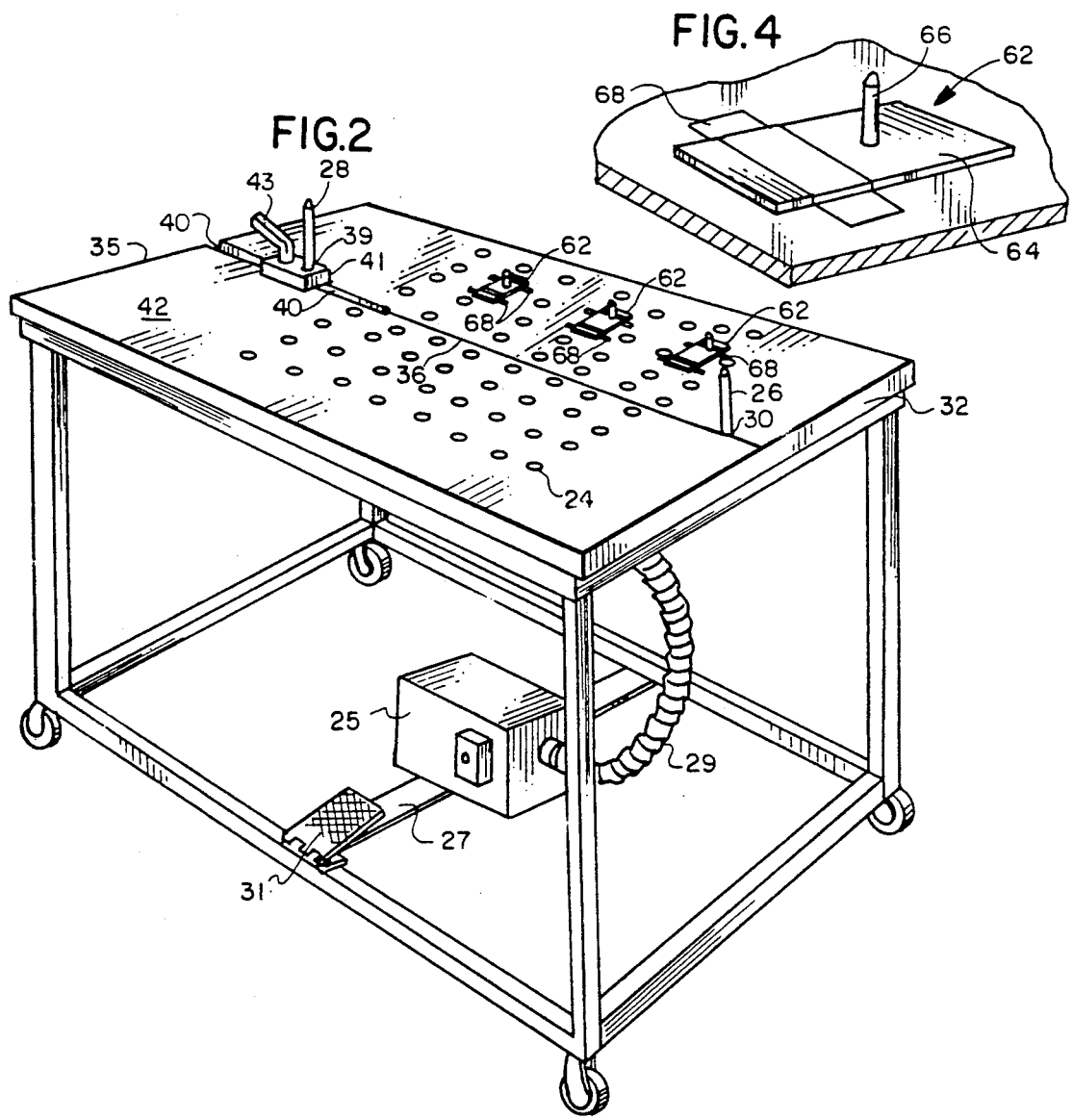
FIG. 4
FIG. 2
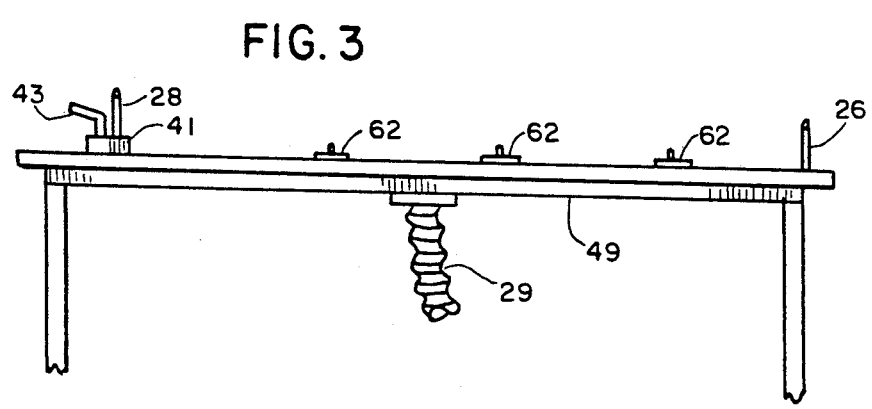
FIG. 3

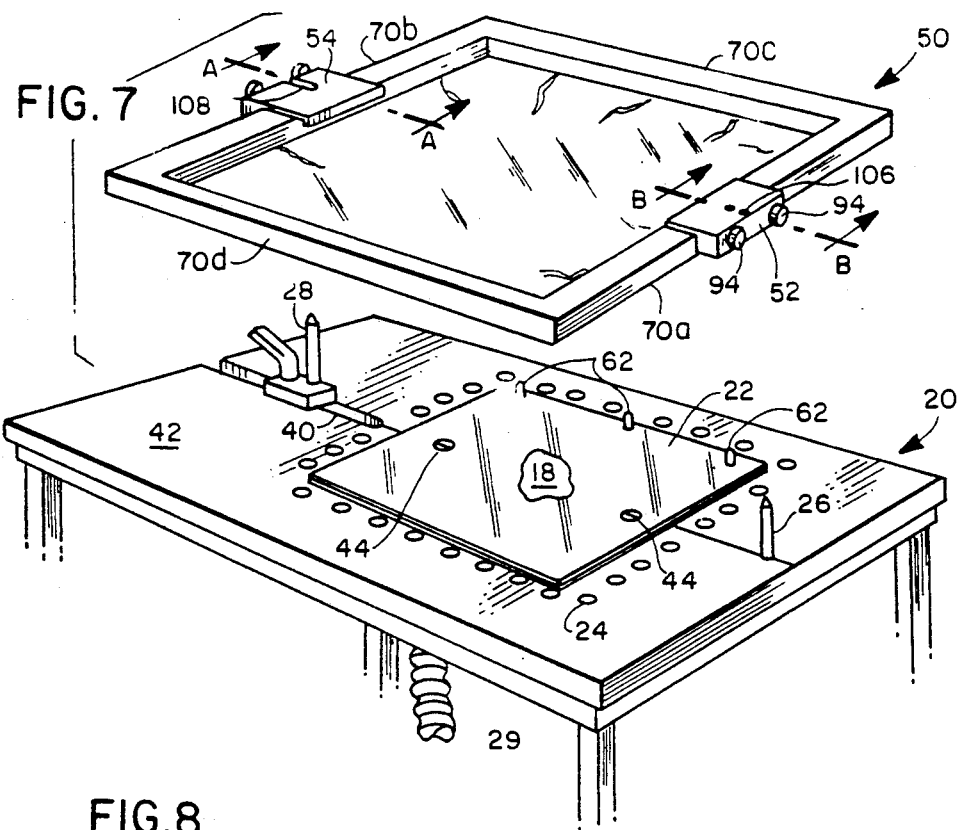
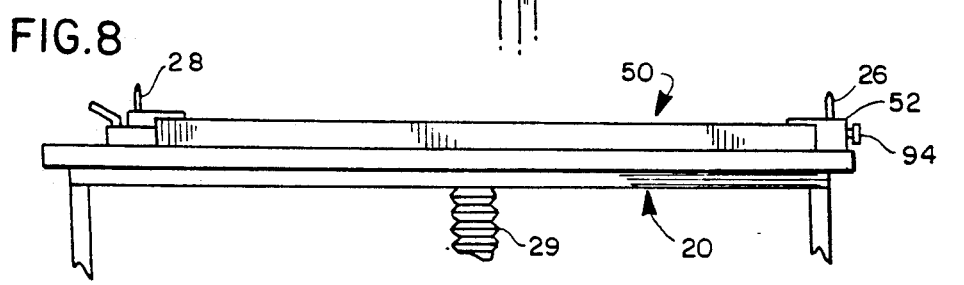
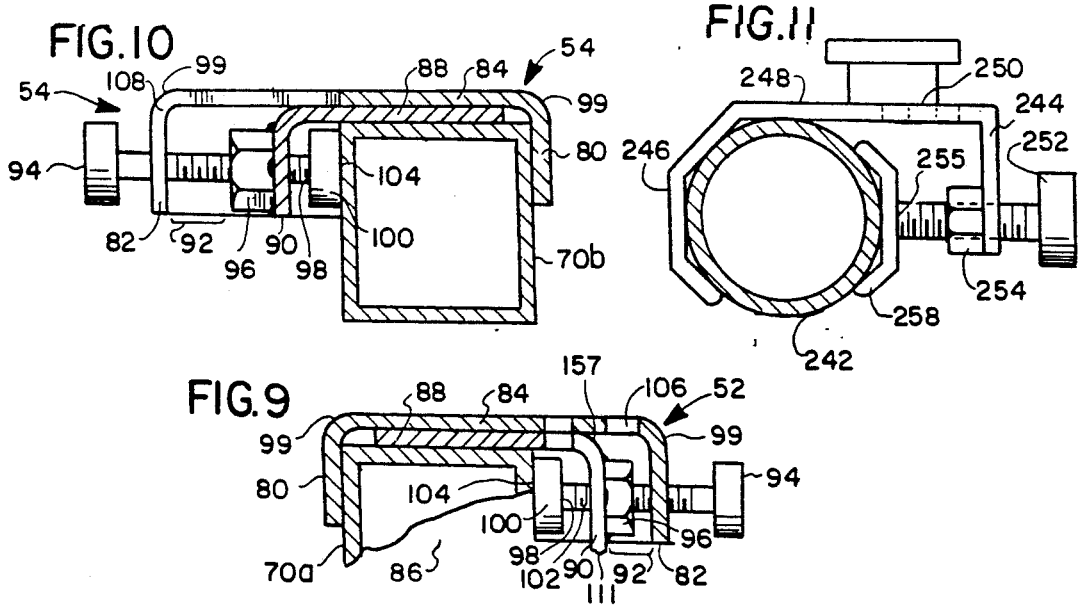

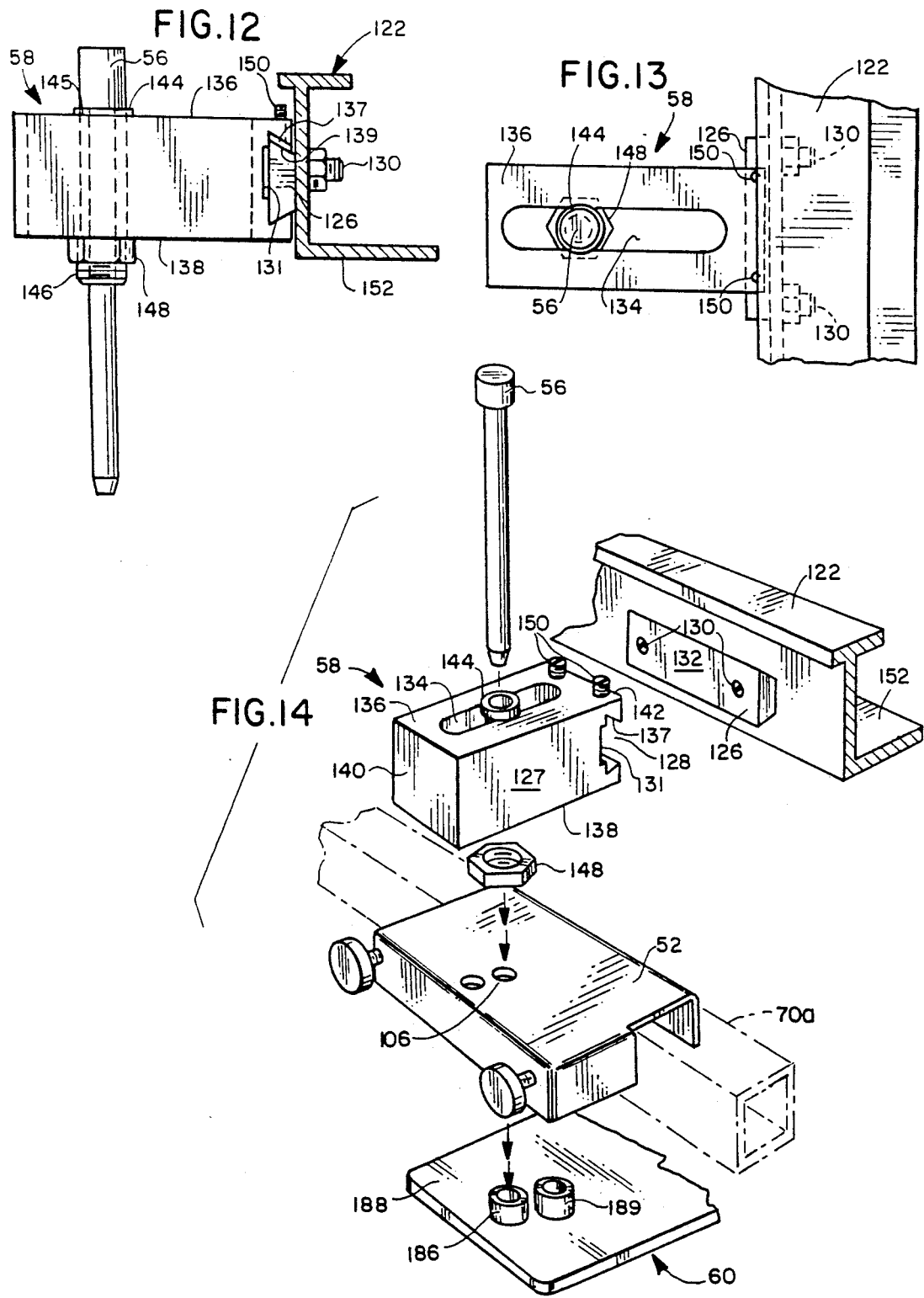

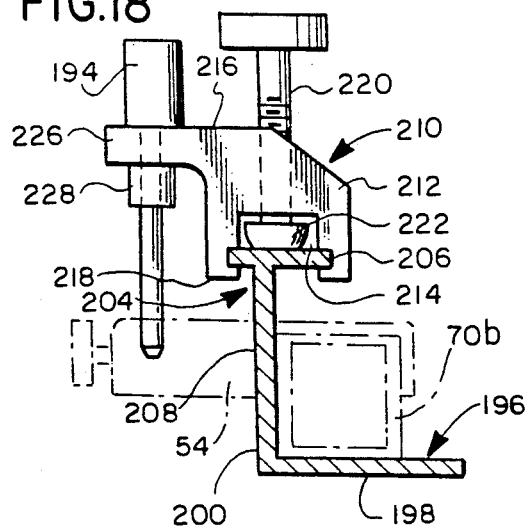
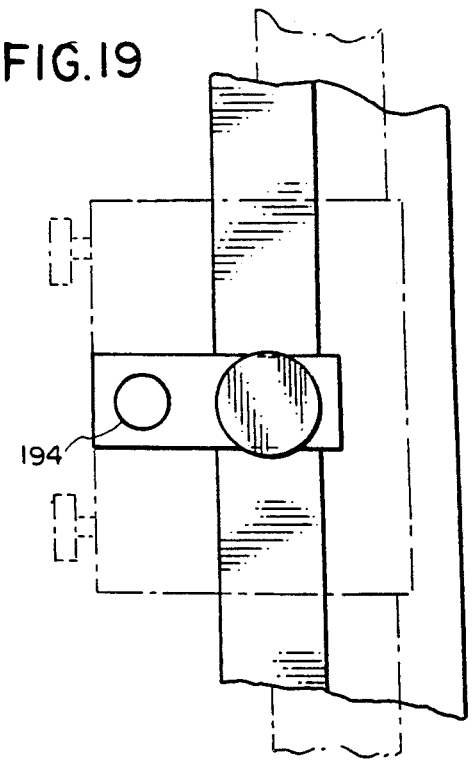
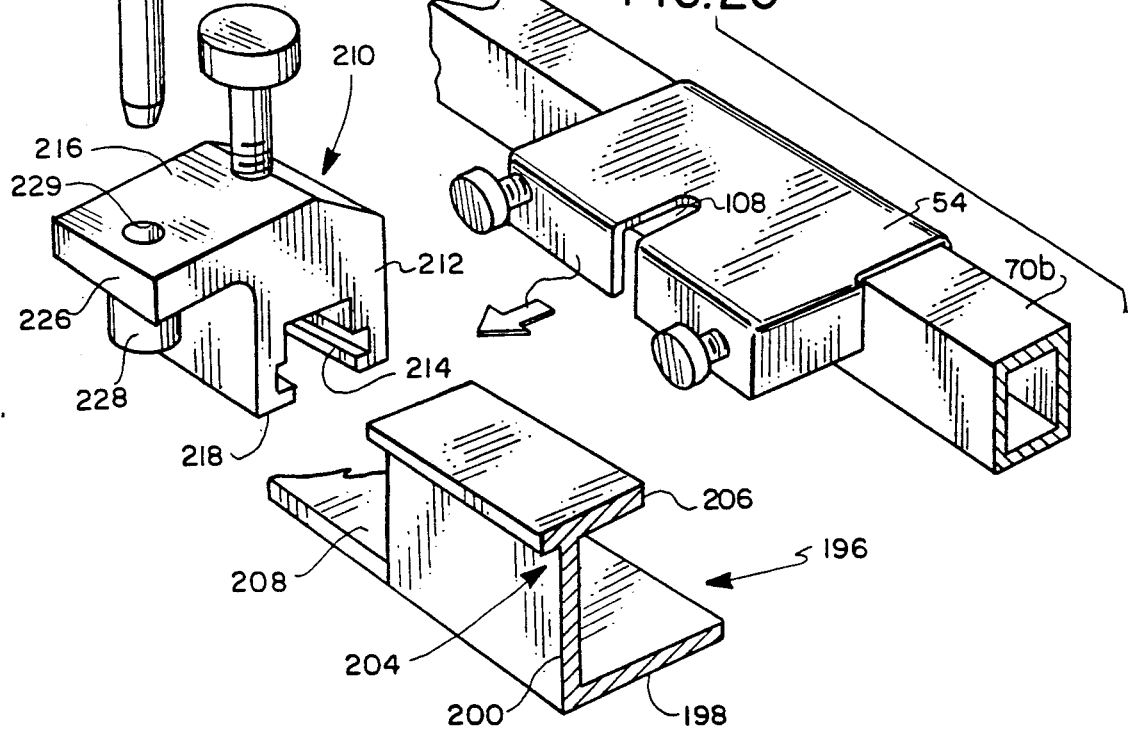

PIN REGISTER SYSTEM FOR SCREEN PRINTERS

FIELD OF THE INVENTION

The present invention is directed to a screen printing apparatus, and especially to an apparatus which is designed to register in alignment multiple screens for printing an image.

BACKGROUND OF THE INVENTION

In screen printing production of objects having multiple colors and complex designs, it is necessary that the workpiece or substrate being printed be moved from station to station so that the successive images applied at each various printing station be maintained in accurate registration with one another. This accurate registration insures that the image actually printed is the image desired. In printing very complex, detailed and colorful images, the allowance for error in positioning of the image on the screen and the positioning of the screen frame in the printing apparatus is small. Especially in high volume production situations, the ability to reduce set up time should result in a significant reduction of the actual cost of producing a printed object.

This invention will be described in connection with, although not limited to, a rotary screen printing apparatus which has a plurality of platens carrying workpieces mounted on a common turntable rotatable in a path beneath a circular array of printing stations. Each printing station contains a printing head and a screen holder frame for holding the screen frame. The screen frame has stretched across it the screen material upon which is an exposed image. In this arrangement, each of the screens in the sequence commonly prints a different image on top of the previously printed image, and moreover, this subsequent image is of a different color and design.

Because images in a printing sequence are printed in a layered fashion to produce a single image, it is necessary that each subsequent image is precisely registered. In the screen printing industry, many different methods and apparatus already exist which after enough time eventually provide registration sufficient to print the desired image. However, as mentioned, these methods consume too much undesirable time which is not cost-effective to the printer. The industry is faced with the demand of printing many different and colorful designs on a short notice. For example, many exhibit shows, trade shows, sporting events and charitable events, just to name a few, offer or sell some printed object for either advertisement or souvenir purposes. The volume and design demands of today require that the printer be able to easily change the printing machine for different print jobs.

Today, the printer desires an apparatus and method in which the printing machine down time for this change is relatively short. In addition to job changes, the screens need to be removed from the printing machine to clean the build-up of dry ink from the screens. This procedure requires that the screen be removed from the machine to be washed. In replacing the screen, the registration procedure has to be repeated and can be a time-consuming process. It is therefore desired that the printer be able to quickly remove and re-register the screen in the printing machine. Thus the printing machine must be equipped with a device whereby the screen frame can be quickly replaced to a registered position.

In a method commonly used, the images are all generally centered on the screens, and then, the screen frames are placed in a screen holder or mounting device. The printing cycle is then started, and a trial and error procedure is used. An object is printed upon, and the results ar analyzed to determine necessary screen adjustments. The screen adjustments are accomplished by moving the screen frames to their predicted corrected position and then tightening the clamps. Equipment often has micro-adjustment devices to allow small vernier displacements to allow shifting of the image a thousandths of an inch. This procedure generally may be repeated several times depending on luck and experience of the printer, thereby increasing the cost because the printing machine is non-operative. Also, the screen frame in many printing machines must be removed to clean the screen, and the above described cost inefficient registration procedure must be repeated when returning the replaced screen frame. As a consequence, this method requires experienced operators or operators with patience to set up the machine for each job. Even with the experienced printers, there is commonly undesirable set up times for these jobs and cleaning tasks.

One current registration procedure involves a micro-adjustment device mounted on the screen frame which is positioned at a zero point mark on the screen holder. The purpose of the micro adjustment device is to provide a common starting point for all the screen frames in their respective screen holders. The starting point is generally indicated as a zero point which is marked on the micro-adjustment device. All the screen frames are placed in their printheads having a mark thereon in the same position on each. This mark on the screen frame is precisely centered on one member of each screen frame. The screen frame is then placed in its screen holder with its mark aligned with the zero position of the micro-adjustment device. Once all the screen frames are placed in the printing machine and having the their mark aligned with the zero point of the micro-adjustment device, the trial and error technique is applied.

However, in using this micro-adjustment system the screen frame does not have to be unsecured from its holder. The micro-adjustment device provides knobs or handles which when turned move the screen frame in the direction desired without having to loosen the screen frame from its holder. Thus, this device and method has improved the set up process, but it does not eliminate the cumulative error because the placement of the screen frames in the printing machine has no relationship to the placement of the image on the screen. The placement of the mark on the screen frame also is very critical in that all the marks must be placed on their screen frame in the same position to insure that the starting point for the micro-adjustment device is the same for each printhead. There further is no relationship between the positioning of the screen frame and the image to the printing surface. The absences of these relationships also further prevent this method from being adequate. Again, the printer must have some experience and patience in setting up this system, which as a result, increases the cost and reduces deserved profits.

Currently, devices are available which provide a relationship between the screen frame and the printing surface. However, these devices and methods do not provide the capability to establish a common relationship between the image placement on the screen, the placement in the printing station of the screen frame and the printing surface. These devices do not prevent cumulative error. The present invention provides a method and apparatus for prohibiting much of the cumulative error associated with registering the image and the screen frame in the printing machine.

These devices, such as disclosed in Jennings U.S. Pat. No. 4,738,909, use a collar with pins extending upward from the printing surface plane which are received by a mounting clamp attached to the screen frame. Generally, these pins are very short and require the screen to mate with the printing surface or its plane. The device here is limited to a few printing machines because of this requirement. Many of the machine applicable to these devices generally appear to be of the manual type, and therefore, will not be advantageous to printers using automatic high speed printing machines.

A general object of the invention is to provide a new and improved registration system for a screen printer apparatus.

SUMMARY OF THE INVENTION

In accordance with the present invention, a registration apparatus and method is provided to accurately register film positives, each having an image thereon, on screens held by screen frames and to likewise accurately register each of the screen frames within a printing apparatus in an accurate registration system which reduces set-up time required for the printing machine in an inexpensive manner.

For precisely registering the film positive on the screen maintained by the screen frame, a vacuum table is provided having a generally rectangular surface with many small air suction holes. The table has at each of the farthest separated ends a pair of register pins extending upward perpendicular from a centered position near the opposing edges of the table. The first of these pins is maintained at a fixed position while the second pin is mounted in a slot extending longitudinally in the table to facilitate travel either toward or away from the first fixed pin in order to accommodate screen frames of different sizes.

The film positive is associated upon the table and positioned along a centered line provided on the table using a pair of targets located on the film positive. The targets are positioned generally at each end of the film positive at a center position. A first top edge of the image is generally positioned at a distance toward the slidable register pin, away from the fixed register pin, dependant on the beginning of the squeegee travel of a particular printing machine. The film positive is centered laterally on the table using the targets.

To maintain this established position, the film positive is provided with three holes punched therein to receive three pin tabs. The holes in each film positive are punched so that when all the film positives are placed one on top of another the holes line up identically, and the layered film positives depict the desired multi-color or layered image. The pin tabs each have a flat, thin tab-like portion and a stud or pin extending upward perpendicularly. The pin tabs are placed on the table and secured to the table surface using an adhesive tape at a position where the pins on these tabs are each received by one of the three holes contained in the film positive. These fixed pin tabs insure that all the following film positives placed on the table are registered at the same location on the table and relative to the fixed register pin.

A pair of mounting clamps are associated with the screen frame in a generally centered position on the front and rear ends of the screen frame. A front mounting clamp has a hole matched to receive therein the fixed register pin which extends from the vacuum table, and a rear mounting clamp has a slot matched in width to the width of the slidable register pin mounted on the vacuum table.

Having registered the film positive on the table, an adhesive tape is placed on the film positive with the adhesive side facing upward and extending beyond the perimeter of the film positive. Because the vacuum table is activated, the film positive is intimately mated with the vacuum table preventing any movement as the screen frame including the mounting clamps thereon is lowered down onto the vacuum table. The screen frame is lowered so that the fixed pin and the slidable mounted pin extending upward from the table are received by a registering hole in the front mounting clamp and a registering slot in the rear mounting clamp on the screen frame. The vacuum pulls the screen material, which extends beyond the perimeter of the film positive, tightly to the vacuum table producing a very intimate mating between the film positive and the screen. The film positive is secured to the screen frame by the adhesive tape which faces upward about the perimeter of the film positive.

After the film positive is precisely positioned and secured to the screen, the screen frame is taken to a device to expose the film positive on the screen. The exposure process is done with the front and rear mounting clamps remaining affixed securely to the screen frame. After exposure, the film positive is removed or washed from the screen. The screen frame is now placed in a screen holder on the printing machine. This process is repeated until each film positive is secured to a screen with the image thereon aligned and registered with the clamps on the screen frame carrying the screen and the front and rear mounting clamps.

In order to precisely locate each of the screen frames in the printing machine, a narrow calibration pallet is removably attached to a pallet carrying arm which is cycled through each print station. The calibration pallet is a long rectangular pallet which is narrower than a printing pallet. The calibration pallet has at one end a registration hole with an apertured bushing therein, and at the other end a registration slot. Both the registration hole, and slot on the calibration pallet are for receiving a long registration pin extending between the printhead and the calibration pallet.

At the first printhead, there is a front alignment bracket which is moveable circumferentially to the left or right and which carries an apertured bushing in a slot for front to rear movement along a radial line extending toward the rotational axis of the screen printer. The front bracket will be generally centered on the printhead, and the bushing will be generally centered in the slot of the front bracket to receive the long pin. The long pin is inserted into the bushing to drop down to engage the bushing in the calibration pallet which is loosely mounted on a rotatable turret arm. The front bracket usually will have to be adjusted before clamping the calibration pallet to the radial turret arm. A rear alignment bracket on the printhead is then aligned over the registration slot at the rear end of the calibration pallet, and a long alignment pin is dropped through an apertured bushing on the rear bracket into the underlying registration slot in the rear of the calibration pallet. The rear bracket is movable circumferentially until the long pin is located in the calibration slot at the rear of the calibration pallet, and then the rear bracket is locked in position on the printhead. In this position, the front and rear brackets, which are preferably two brackets mounted on the screen frame, on the printhead are aligned over the registration hole and registration slot in the underlying calibration pallet. The front and rear brackets are now fixed at these aligned positions, and the calibration pallet is also fixed in position on the rotary turret arm.

The calibration pallet is now shifted to a second printing station, and a front bracket of the second printing station is then aligned to have its apertured bushing directly over the bushing in the calibration pallet, and the long alignment pin is dropped through the apertured bushing in the front bracket down into the underlying apertured bushing in the calibration pallet. The front bracket and its bushing are then locked in the aligned position with the front bracket bushing of the second printing station, and as a result, both the bushing on the front bracket associated with the second printing station and on the busing of the front bracket on the previous printing station are located at exactly the same radial distance from the rotational axis. In the circumferential direction, the apertured bushing in the front bracket of the second printing station is located exactly one increment of travel of the pallet arm as it is moved by the turret drive. The rear bracket at the second printing station is aligned over the registration slot in the rear of the calibration pallet, and a long alignment pin is dropped through the apertured bushing of this rear bracket down into the underlying slot of the calibration pallet at the second printing station. Thus, the front and rear brackets at the second printing station will be located on a radial path exactly one increment from the previous path associated with the front and rear brackets of the previous printing station.

This process is repeated for each of the printing stations with the calibration pallet being indexed from station to station in order to have the apertured bushing of the front bracket at each printhead at the same radial distance form the rotational axis. The rear bracket at each printhead will have its apertured bushing on a radial line with the front bushing with the same circumferential, index spacing between each successive printing station. The calibration pallet is now removed, and a regular work supporting pallet is substituted therefore.

The screen holders each have their front and rear mounting clamps fixed in position at the vacuum table and are now brought to the printing machine with the first screen holder positioned on the screen frame beneath the front and rear brackets on the screen holder. Alignment pins are then inserted down through the front apertured bushing on the front screen holder bracket and into the aperture in the front mounting clamp on the screen frame. A rear alignment pin is then inserted into the hole in the rear bracket of the screen holder to drop down into the slot in the rear mounting clamp on the rear screen frame to align the line between the front and rear mounting clamps on the screen frame along the radial line between the print head brackets. The screen frame is locked or clamped in place on the screen holder.

The printer then goes to the second printing station with the second screen frame and places it below the apertured bushing of the second front bracket of this second screen holder and inserts the front alignment pin through the apertures in the front bracket and the underlying hole of the front mounting clamp of the screen frame to locate the front of the image at the same radial location as the front of the image at the first printing station. The second rear alignment pin is then inserted into the hole in the rear bracket and down to the slot on the rear mounting clamp of the screen frame to align the rear end of the screen frame with the radial line exactly one increment of index travel and parallel to the radial line previously established by the calibration pallet. The second screen frame is then locked in this calibrated position.

The above process is repeated to align each of the screen frames at their respective printhead with the aperture in the front mounting clamp of the screen frame at the same radial distance from the rotational axis and its circumferential spacing the same as one indexing movement (or a whole number multiple thereof if an intervening station is not used for printing) of the pallet.

When using the same size of screen frame for successive jobs, it should not be necessary to use the calibration pallet between printing jobs. The screen frames are merely brought to each printing station and positioned on the screen holder. The front alignment pin is dropped into place through the aligned front apertures of the front bracket and front mounting clamp; and the rear alignment pin is dropped into place through aligned aperture of the rear bracket aligned with the slots of the rear mounting clamp of the screen frame. Then the screen frames are clamped in position, and the alignment pins are then removed. There is no need to adjust the position of the front or rear brackets or to use the calibration pallet.

When using a different size of screen frame, it is usually necessary to re-install the calibration pallet and to re-position each rear bracket of the screen holder with the aperture over the calibration slot and to drop the alignment pin through the aperture and down to the slot in the calibration pallet. The rear bracket is fixed in this aligned position. Each rear bracket is re-positioned using the calibration pallet. While it is theoretically possible to move the rear bracket on a straight radial line with a change in screen frame size, it does not work in practice for registering successive screen printed images. Hence, the calibration pallet is used again when changing screen frame sizes to assure that the rear bracket, which was moved with a change in screen holder size, is exactly in calibration with the calibration pallet, while the front portion of the screen holder is not moved but is at the same radial position.

For tight screens, it has been found that no micro adjustments are needed after test or sample printing. However, when the screens are loose or different squeegee pressures are applied micro adjustments may be necessary after a trial run. Micro adjustments theoretically move the screen frames from being registered in the printing machine under a static condition to a condition compensating for dynamic machine operations.

A general object of the invention is to provide a new and improved registration method and system.

BRIEF DESCRIPTION OF THE DRAWINGS

The present invention will be described in connection with the accompanying drawings, which illustrate the preferred embodiments and details of the invention, and in which:

FIG. 2 is a perspective view of an embodiment of a vacuum table and members thereon constructed in accordance with the present invention;

FIG. 3 is a fragmentary elevational view of the apparatus shown in FIG. 2;

FIG. 4 is an enlarged perspective view of an embodiment of a pin tab member shown generally thereon the apparatus shown in FIG. 2;

FIG. 7 is an exploded view depicting a screen frame in accordance with this invention positioned above the apparatus shown in FIG. 2;

FIG. 8 is a fragmentary elevational view of the apparatus of FIG. 2 associated with the screen frame;

FIG. 9 is an enlarged cross sectional view of a front mounting clamp used with the screen frame taken along line B—B of FIG. 7;

FIG. 10 is an enlarged cross sectional view f a rear mounting clamp used in accordance with the screen frame taken along line A—A of FIG. 7;

FIG. 11 is an enlarged cross sectional view of an alternative mounting clamp employed in accordance with the principles of the present invention;

FIG. 12 is an elevational view of a front alignment bracket which is generally shown in FIG. 1;

FIG. 13 is a plan top view of the front alignment bracket depicted in FIG. 12;

FIG. 14 is an exploded perspective view depicting the association of the embodiments, generally shown in FIGS. 10, 12 and 17, in the registration of the screen frame in the printing machine shown in FIG. 1;

FIG. 18 is an elevational view of a rear alignment bracket used in accordance with the present invention;

FIG. 19 is a plan top view of the rear alignment bracket shown in FIG. 18; and

FIG. 20 is an exploded perspective view depicting the association of the embodiments generally shown in FIGS. 18 in registering the rear of the screen frame in the printing machine shown in FIG. 1.

DETAILED DESCRIPTION OF THE INVENTION

Figure 1:
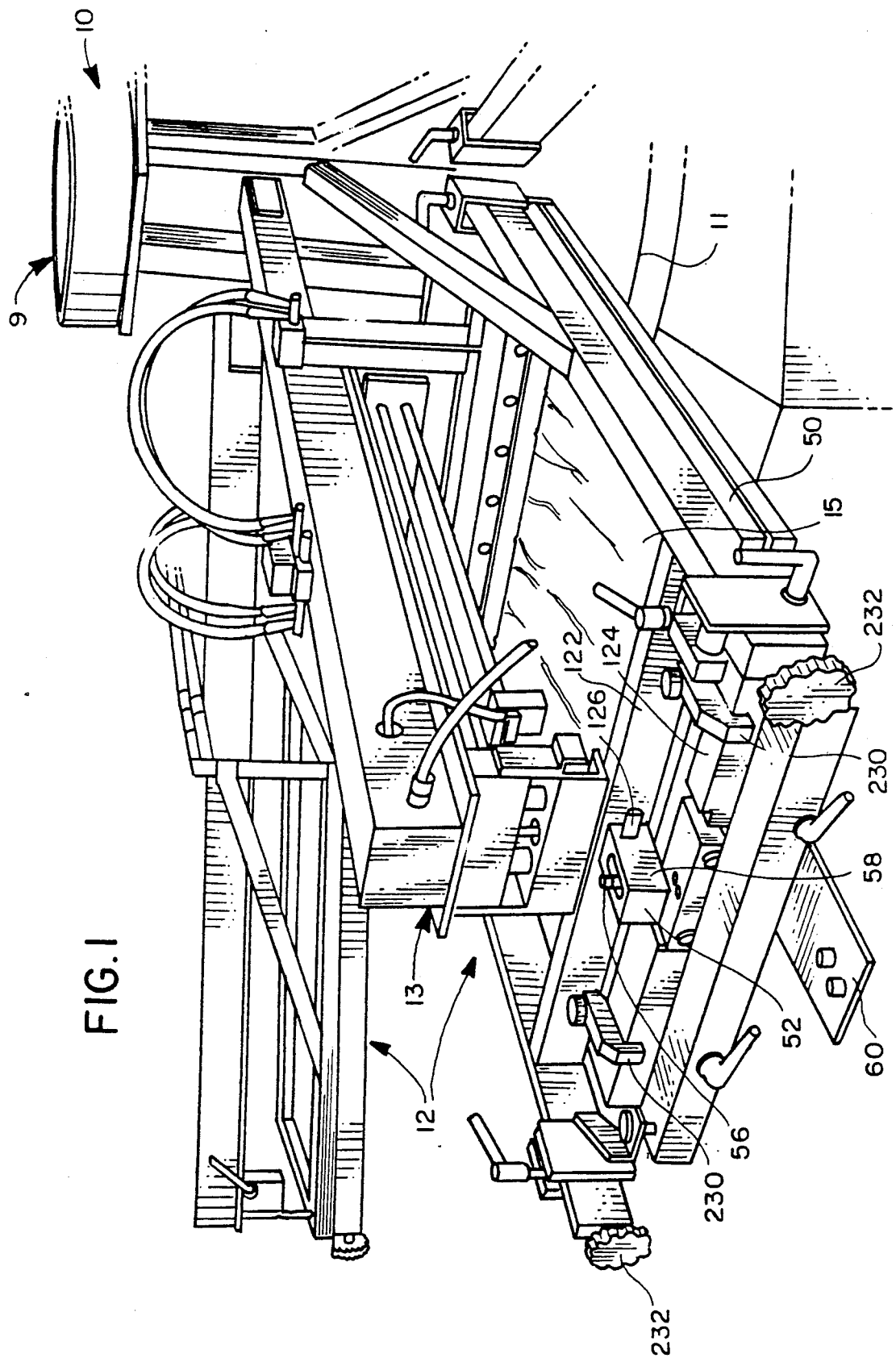
FIG. 1 is a fragmentary perspective view of a screen printing machine employed in accordance with the present invention.
Figure 5:
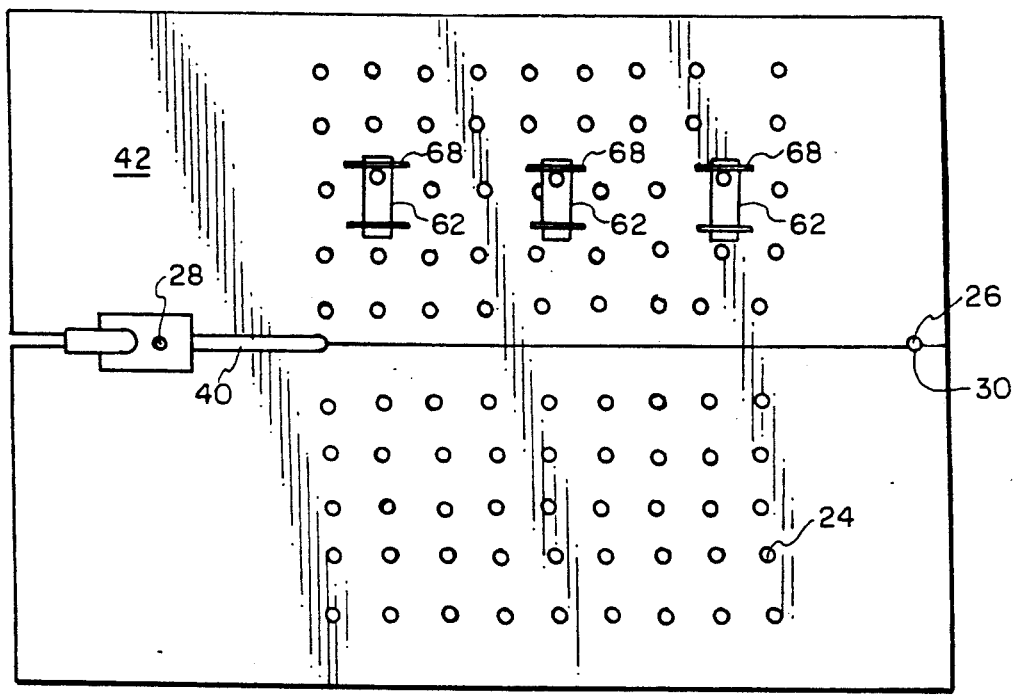
FIG. 5 is a diagrammatic plan view of the apparatus generally shown in FIG. 2.

It is common in the screen printing industry to provide a printing machine 10 having a plurality of printing stations 12 arranged in a sequential array, as shown in FIG. 1, wherein each printing station 12 prints a different color image to produce a composite color printed image on a workpiece or substrate. The printing machine 10 of FIG. 1 is designed to produce detailed, complex and colorful images with these multiple printing stations 12. Because consumers demand quick production and a variety of product designs and colors, it is therefore required that each printing station 12 have the ability to be registered and calibrated quickly to accurately place the images of each subsequent printing station precisely in their required layered position to produce the desired composite color image.

A common printing machine 10, as shown in FIG. 1, is generally known to have a rotatable turntable 11 rotating about a central axis in a central column 9 providing a plurality of printing supports, pallets or platens, rotatable to and beneath each of a plurality of printheads 13 located at the various printing stations 12 displaced in a predetermined sequential array. During operation of the printing machine, the substrate to be printed upon travels beneath each of the printing stations 12. Each printing station 12, having a printhead 13 and a screen 15 mounted on a screen frame 50, prints a specific image in a precise location. This layering technique enables complex and very colorful objects to be printed. However, the problem commonly occurs in the ability to accurately, quickly and efficiently prepare the printing machine 10 for printing different images. The image must be placed precisely on the screen 15 and its screen frame 50 and must be placed precisely in the print station 12.

The present invention provides an apparatus and method for placing the image 18 on the screen 15 carried by the screen frame 50 and for placing the screen frame 50 in the printhead 13. Referring to FIGS. 1, 7, 14 and 20, the solution to the problem of registering a plurality of images 18 used to produce the overall desired multi-layered print on a substrate begins with the precisely positioning each of a plurality of image film positives 22 on each of their respective screen frames 50 with respect to a pair of reference points affixed on a support such as vacuum table 20. All successive film positive 22 are positioned on the vacuum table 20 in respect to reference point 30, and all mounting clamps 52, 54 secured to the screen frame 50 are positioned on the vacuum table and registered with the reference point 30. The location of image 18 does not depend on its placement on the screen 15 or the placement of the screen frame 50 in the printing station per se. The location of image 18 on the screen frame 50 only requires that it be generally centered thereon. Each image 18 on each screen frame 50 is precisely positioned relative to the fixed reference point 30 and a second alignment reference point 31 on the vacuum table 20 which aligns the screen frame 50 after its association with reference point 30.

As shown in FIG. 2, a vacuum table 20 is used to precisely locate each of the film positives 22 (FIG. 6) at an identical location with respect to the fixed reference point 30 and to provide a means for mounting each film positive 22 on its screen frame 50 (FIG. 7) with respect to the fixed reference point 30. As a result, the vacuum table 20 enables each of the film positives 22 to be positioned at the same location on the vacuum table 20 and positioned on the screen frame 50 at the same location with respect to the fixed reference point 30.

More specifically, the preferred vacuum table 20 has a continuous rectangular planar surface 42. The surface 42 holds a pair of register pins 26 and 28 which assist in the placing of the film positives 22 on the table surface 42 at a particular location and for associating each film positive 22 with its respective screen frame 50. The film positive 22 only needs to be generally centered on the screen frame 50 because as is explained the screen frame 50 is associated with the film positive 22 using register pin 26 which is fixed and register pin 28 which aligns the screen frame 50 with the fixed register pin 26.

The fixed register pin 26 extends upward and perpendicular to the surface 42 from a location 30 which is generally centered and near edge 32, where edge 32 spans the width of the table 20. The fixed pin 26 represents the reference point 30, already mentioned, from which all the measurements and registration procedures are in relation thereto.

Near the opposite edge 35, which is directly opposite edge 32 and which also spans the width of the table 20, is located slidable register pin 28 which is movably mounted in order to facilitate sliding lengthwise a few inches in a slot 40 on the surface 42. Likewise, the slidable pin 28 is located generally centered on the table near the opposite edge 35. Slidable pin 28 provides for alignment of the screen frame 50 with the fixed pin 26. Slidable pin 28 is mounted on a slidable block 41 which slides over the slot 40 and has a clamp actuated by a clamp handle 43 to lock the block 41 and the slidable pin 28 in a fixed position on the table 20. The block 41 and slidable pin 28 are slidably mounted in slot 40 to provide the capability for registering screen frames of varying lengths. Slidable pin 28 is moved toward the fixed pin 26 for shorter screen frames and opposite for longer screen frames.

The table surface 42 is provided with a centerline 36 connecting the fixed pin 26 and the slidable pin 28. The centerline 36 is used to align a pair of targets 44 on the film positive 22, best seen in FIG. 6, to center the film positive 22 thereon the table surface 42. The film positive 22 is positioned along the centerline 36 by placing the targets 44 on the centerline 36 at a distance away from the fixed pin 26 toward the center of the table surface 42. This distance is determined by the dedicated squeegee starting location which is printing machine dependant; for example, a common starting point for a Champrint printing machine is 6¼ inches measured from the fixed pin 26 along the centerline 36 toward the slidable pin 28. These particular starting points are marked directly on the surface 42 and preferably using a line or mark 46 perpendicular to the centerline 36 and at the particular squeegee starting location away from the fixed pin 26 and toward the slidable pin 28.

Each film positive 22 commonly has a rectangular or square configuration and is equipped along an edge 37 with a plurality of linearly aligned holes 34. The holes 34 may be on the top edge as well as a side edge. Usually the photographer providing the film positives 22 has the holes 34 already in each of the film positives 22, and the holes 34 of each film positive 22 exactly aligned. As shown best in FIG. 6, the placement of the holes 34 allow each film positive 22 to be precisely placed on the table 20. That is, these holes 34 are placed in each film positive 22 at the same location, and they are all fitted into pin tabs 62 which provide a means by which each film positive 22 can be placed on the surface 42 of the table 20 at a same location.

Figure 6:
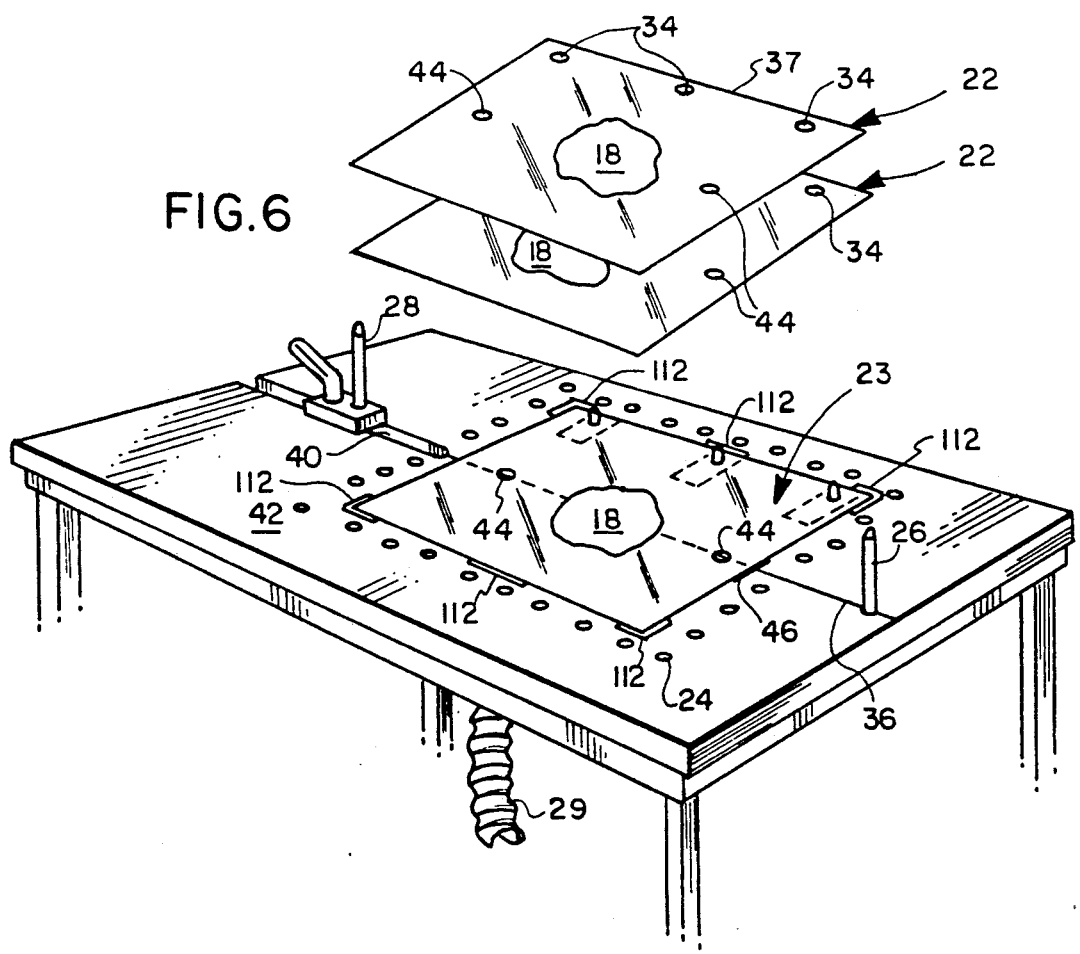
FIG. 6 is an exploded view depicting a method using the apparatus generally of FIG. 2 and showing film positive members positioned generally above.

Once a first film positive 23 is located on the surface 42 of the table 20, as best shown in FIG. 6, using the above described procedure, pin tabs 62 are fixed to the table 2 with its upright pin 66 projecting through a hole in the film positive 22 to maintain the first film positive's 23 position. The pin tabs, as shown in FIG. 4, are readily commercially available. Each pin tab 62 is provided with a thin, flat rectangular stainless steel tab 64 from which the short, tapered tip pin 66 extends perpendicularly upward at approximately ⅓ distance across the length of the pin tab 64 and centered widthwise. This positioning of the pin 66 on the pin tab 64 provides sufficient room remaining on the pin tab 64 to lay an adhesive tape 68 across the tab 64 for securing the pin tab 62 to the surface 42 of the table 20.

Thus, the pin tabs 62 are secured to the surface 42 at a location where each of the pins 66 projects through one of the holes 34 in the film positive 22. In addition to the pins 66, the film positive 22 is held in its desired location by a vacuum applied to an underside of position of the table 20 and through holes 24 in the table surface 42 from a vacuum pump 25 mounted below the table on a frame support 27.

The plurality of holes 24 are equally and continuously spaced across the surface 42 of the table 20. A hose 29 (FIG. 3) is attached to a bottom table plenum 49 located beneath the surface 42 of the table 20 and provides a connection between the vacuum pump 25 and the plenum 49 of the table 20. The advantage of using the vacuum table 20 is that once the film positive 22 is positioned in its desired location, the table 20 is activated, and the film positive 22 is intimately mated to the surface 42 of the table 20. The activation of the vacuum pump 25 is easily done by a supplied foot pedal 31. This advantage prevents the film positive 22 from being easily displaced from its desired location during the subsequent securing of the film positives 22 to the screen frame 50 and its mounting clamps 52 and 54. As the film positive 22 is intimately mated with the surface 42, each pin tab 62 is secured to the surface 42 with an adhesive tape 68 across an area of the base 64 located opposite the pin 66 (FIG. 4).

As shown in FIG. 7, the screen frame 50 is associated with the table 20 after the film positive 22 is secured on the surface 42 by the pin tabs 62 and the vacuum. The screen frame 50 is a rectangular configured frame constructed from four tubular rectangular cross-sectional members 70a-d over which the screen material 15 is stretched. Located on the front member 70a and the rear member 70b, which are spaced the farthest apart, and generally centered thereon is the front mounting clamp 52 and a rear mounting clamp 54, respectively.

Referring to FIG. 10, the front mounting clamp 52 employed in FIGS. 7, 8 includes an inverted channel having a first side 80, a second side 82 substantially parallel to the first side 80, and a top web 84 extending substantially perpendicularly to the sides 80, 82 and connecting them at its opposite ends. A top portion 86 is open between the sides 80, 82.

Contained within sides 80, 82 and web 84 is an angle shaped member having a top plate 88 spot welded to the web 84 and including a depending leg 90 substantially parallel to the second side 82 and perpendicular to plate 88. A narrow groove 92 is formed between leg 90 and side 82 and a nut 96 is fixed to the leg 90 and projects into the groove 92.

A pair of conventional clamping screws 94 extend through the second side 82 and each is threaded into a nut 96 and extending therethrough to a nylon foot 100 secured to the free end of the screw 94. To tightened down the mounting clamp 52 in an immovable relationship with the screen frame 50, the screw 94 is turned to push the nylon foot 100 against a facing side of the screen frame member 70a. As mentioned before, it is not essential that the mounting clamp 52 be in the center, only that it is preferred to be generally centered to insure that the image 18 is completely contained on the screen frame 50. More specifically, the front mounting clamp 52, in addition to the hole 106, has a second hole 110 adjacent the hole 106 and which extends through both bottoms 84, 88.

The front mounting clamp 52 has an alignment hole 106 for receiving the fixed register pin 26 of the vacuum table 20 and the long alignment pin 56 during registration of the screen frame 50. Hole 106 extends through web 84 and the groove 92 at a position centered widthwise and lengthwise in the groove 92. In addition to the hole 106, a second alignment hole 110 extends through the web 84 and the top plate 88 to provide for variations in printing machine design. Hole 110 is located at a position centered lengthwise but adjacent to hold 106 widthwise on the front mounting clamp 52 so as to have the depending leg 90 pass therebetween. However, a slot 107 is provided in the depending leg 90 at a location the location where it passes between hole 106 and 110 to provide clearance for the long alignment pin 56 after being received by either of the holes 106, 110. Slot 107 runs from a free edge 111 of the depending leg 90 perpendicularly to the top plate 88.

The rear mounting clamp 54 (FIG. 9) is substantially identical to the front mounting clamp 52 and similar reference characters are used for each of them. The major difference between the front mounting clamp 52 and the rear mounting clamp 54 is found that the rear mounting clamp 54 is provided with a slot 108 (FIG. 7) in the top web 84 whereas the front mounting clamp 52 has the hole 106. The slot 108 of the rear mounting clamp 54 extends perpendicular to the second side 82 and half the distance across the bottom 84 and the plate 88. Additionally, the slot 108 is continued through the second side 82, thus, extending the slot 108 continuously.

An alternate front mounting clamp 240, as shown in FIG. 11, provides a design configured to attach to a roller type screen frame formed from a plurality of round tubular members, such as the member 242. The mounting clamp includes a first side 244, a second side 246 having a C-like configuration opening toward the first side 244. Extending between the first side 244 and the second side 246, a web 248 having a hole 250 therein for receiving the long alignment pin 56. A pair of conventional clamping screws 252 each having a nylon foot 258 attached thereon a free end 255 extend through the first side 244 each to a threaded nut 254 welded to the first side 244 facing the second side 246. The nylon foot 258 is C-shaped and is attached to the screw 252 to engage the round tubular member 242. A rear tubular mounting clamp has identical features except instead of a hole 250, it has a slot similar to slot 108 of the rear mounting clamp 54.

Referring now to FIGS. 7 and 8, the screen frame 50 including the front mounting clamp 52 and the rear mounting clamp 54 is associated with the film positive 22 which is secured on the vacuum table 20 by the pin tabs 62 and the vacuum of the table 20. The slidable pin 28 is moved in its slot 40 to a position which provides sufficient distance between pins 26, 28 in order for the hole 106 of the front mounting clamp to receive the fixed pin 26 and the slot of the rear mounting clamp 54 to receive the slidable pin 28. The pins 26, 28 are provided with a diameter which fits precisely in the hole 106 and the slot 108 with only slight clearance to ensure accurate placement of the film positive 22 with respect to the fixed reference point 30 and alignment from the moveable reference point 31. The slidable pin 28 is not required to be precisely positioned in the fore and aft direction along the centerline 36 because its function is to restrict swinging or tail wagging in the lateral direction about fixed pin 26 as a pivot point.

Once the screen frame 50 is lowered upon the table 20 as shown in FIG. 8, the fixed pin 26 and alignment hole 106 of the front mounting clamp 52 prevent the screen frame 50 from being displaced in the lengthwise and widthwise direction about the table 20. Also, the slidable pin 28 is to provide alignment with the fixed pin 26 by preventing tail-like whip movement of the screen frame 50 about the fixed pin 26 as the film positive 22 is temporally affixed to the screen frame 50. An adhesive tape 112 (FIG. 6) has been affixed about the film positive's 22 perimeter having its adhesive side facing upward and extending beyond perimeter of the film positive 22. The adhesive tape 112 is used to secure the film positive 22 to the underside of the screen frame 50. The vacuum table 20 additionally provides vacuum on the underside of the screen frame 50 to pull or force an intimate mating effect between the film positive 22 and the screen frame 50.

After the film positive 22 is secured to the screen frame 50, the vacuum table 20 is deactivated, and the screen frame 50 is transported to an exposer without removing the front mounting clamp 52 or rear mounting clamp 54. The mounting clamps 52, 54 are each provided with rounded edges 99 so as not to damage a blanket which is used to lay over the screen frame 50 during exposure of the film positive 22 on the screen frame 50.

Thus, it will be seen that the film positive 22 has been precisely located on the screen frame 50 relative to the hole 106 in the front mounting clamp 52 and the slot 108 in the rear clamp 54. The above described process is repeated for each film positive 22 with each film positive 22 being located on the pin tabs 62 and thus relative to the pins 26 and 28 in exactly the same position. The front and rear clamps 52 and 54 are then positioned on the pins 26 and 28 in exactly the same position. The front and rear clamps 52 and 54 are then positioned on the pins 26 and 28 and each film positive 22 is then adhered to its registered screen frame 50. Thus, each positive image is positioned exactly with respect to the hole 106 in the screen frame front clamp 52 and the slot 108 in screen frame rear clamp 54.

Figure 15:
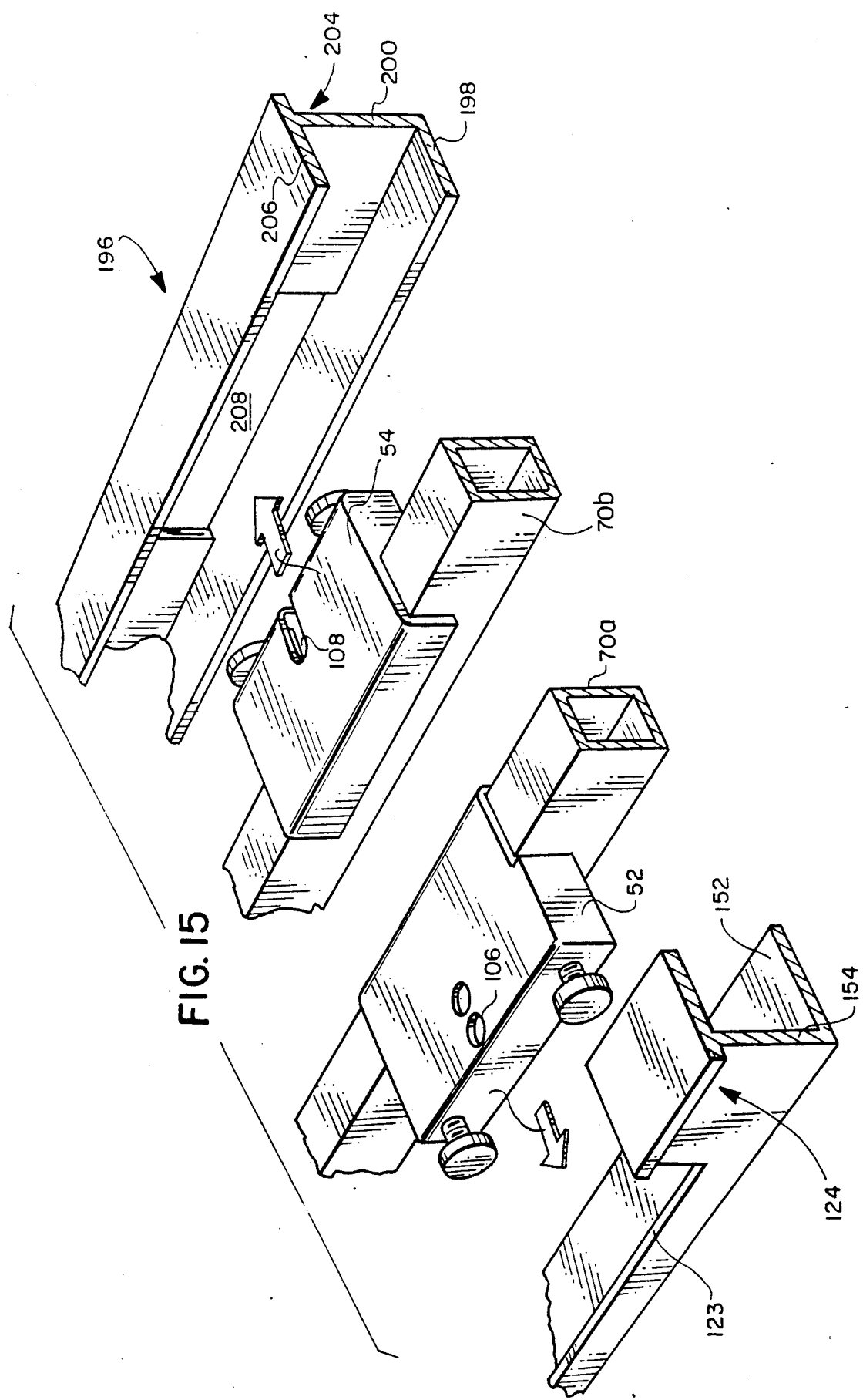
FIG. 15 is a fragmentary, exploded perspective view depicting a frame holding the screen frame having the front and rear mounting clamps mounted thereon.

As shown in FIGS. 1 and 15, a front screen holder 122 has an L-like configuration with a horizontal leg 152 for which rests the screen frame front side 70a and a vertical wall 154 from which the front mounting clamp 52 projects through a rectangular topless opening 123. A similar rear screen holder 196, described in detail later, extends parallel to the front screen holder 122 for which rests the screen frame rear side 70b.

Referring to FIGS. 1, 12, 13 and 14, to register the screen frame 50 accurately in the printing machine 10, each printhead 13 has a pre-calibrated front bracket 58 fastened to a front frame member 122 which extends parallel across the front of the printhead 13. The front bracket 58 is attached to the front frame member 122 using a dove tail 128 and gib 126 combination. The gib member 126 is screwed to the front frame member 124 at a generally centered position thereon using a pair of screws 130 which are also set below an outer mating surface 132 of the gib 126 to provide a smooth continuous surface 132 for the dove tail 128 to slide on the gib 126. If the screws 130 are not entirely set below the surface 132, the dove tail 128 is provided with a recess groove 131 in which a screw portion extending above the surface 132 may travel.

As best shown in FIG. 14, the front bracket 58 has a block body 127 of a rectangular configuration having a continuous slot 134 extending from a top 136 through to a bottom 138. The front bracket 58 has a pair of ends, an outer end 140 and an inner end in which the dove tail 128 is formed. The dove tail 128 is easily mated with the gib 126 to attach the front bracket 58 to the front frame member 122. The dove tail 128 and gib 126 allow sliding of the block 127 relative to the front frame member 122. When the screen printing press is initially set up the front brackets are all located and fixed in place. The front bracket 58 is secured in its calibrated position by a pair of allen set screws 150 which extend through the top 136 and engage a gib plate 137 to push the gib plate 137 down against a top side 139 of the gib 126, thereby restricting the sliding of the front bracket 58 along the gib 126.

The slot 134 of the front bracket 58 is provided with a bushing 144 having a threaded portion 146 extending beyond the bottom 138 of the front bracket 58 on which a nut 148 is screwed to tighten in order to secure the bushing 144 at a desired location which prevents it from being displaced in a radial direction. The bushing 144 has a hole which receives the long alignment pin 56 for registering the screen frame 50. The calibrated location for the front bracket 58 and its bushing is at a location which provides equal arcuate spacing or distance between each of the brackets 58 on their respective printing heads 13 within the printing machine 10 and where each front bracket bushing 144 is at the same radial distance from the center column 9. The calibration of the front bracket 58 is generally done only when the machine is set up originally or when the front bracket 58 is being added later as an accessory to a printing machine 10 and is done with a calibration pallet as will now be described.

Figure 16:
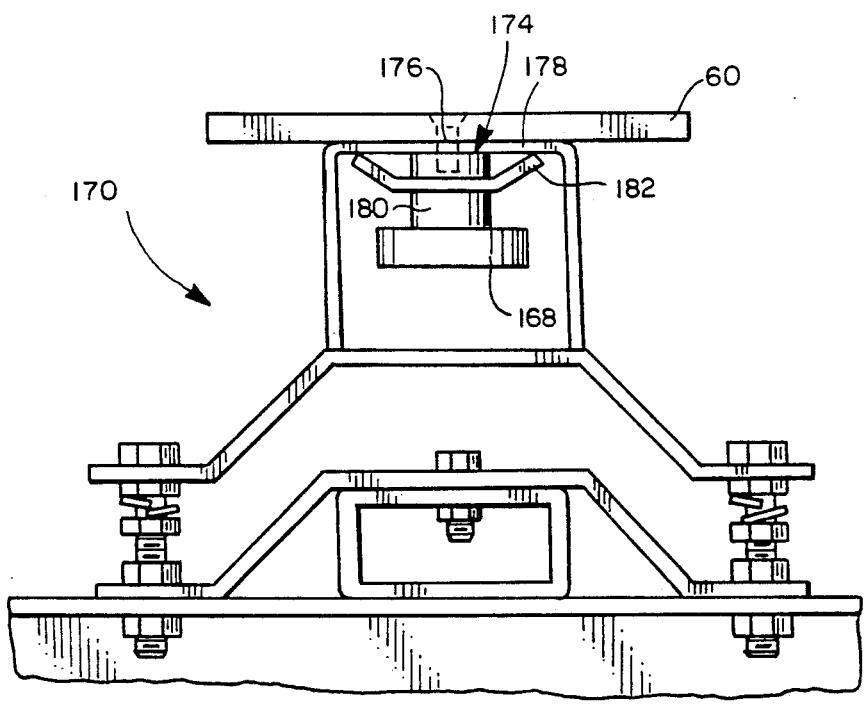
FIG. 16 is an elevational view of a calibration pallet in accordance with the present invention mounted on top of a pallet carrying member of the screen printing machine shown generally in FIG. I.
Figure 17:
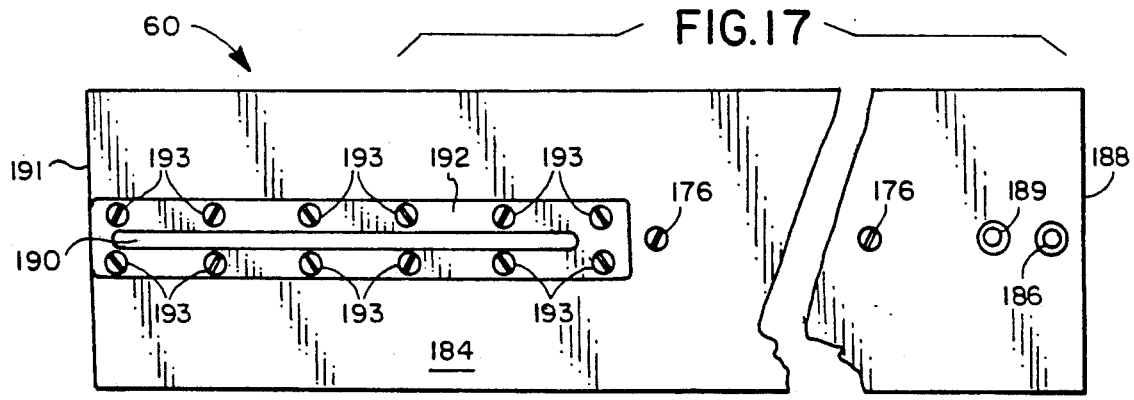
FIG. 17 is a fragmentary plan view of the calibration pallet used in accordance with the present invention shown in FIG. 16.

As best seen in FIGS. 16 and 17, the rotatable turntable type printing machine 10 has the rotatable turntable 11 (FIG. 1) having a plurality of radially extending pallet carrying arms 170. A calibration pallet 60 is fixed to one of the rotatable arms 170 by removing the usual pallet which would hold a T-shirt or the like and replacing it with the calibration pallet 60. The calibration pallet 60 is best carried upon a pallet carrying arm 170 which provides means for assuring that a printing pallet is level. The illustrated pallet carrying arm 170 is disclosed in greater detail in co-pending patent application Ser. No. 592,037. The pallet carrying arm 170 as a channel 174 for receiving a plurality of clamping screws 176. The clamping screw 176 passes through a clamping bracket 182 extending longitudinally within, and when the screw knob 168 is tighten to clamp the underside of channel wall 178, the calibration pallet 60 is secured in position. A clamping nut 180 having the knob 168 is used to tighten and secure the clamping bracket 182 to the channel 174 and thereby secure the calibration pallet 60 to the channel 174. The knob 168 is generally made of plastic.

As best seen in FIG. 17, the calibration pallet 60 is a narrow rectangular aluminum plate having a top surface 184 upon which is centered near an outer end 188 at least one alignment bushing 186. An additional alternate alignment bushing 189 is added to proved for more flexibility in machine design and screen frame length. At an inner end 191, a slot 190 is provided of length approximately ¼ the length of the calibration pallet 60. The slot 190 has its perimeter formed of a harder metal 192 which is screwed, welded or bolted 193 to the surface 184 of the calibration pallet 60. The harder material 192 prevents the surface 184 from being damaged during the calibration procedure. The clamping screws 176 are equally spaced lengthwise down the center of the calibration pallet 60 and centered widthwise.

Referring again to FIG. 14, the calibration pallet 60 is mounted to the calibration arm 170 and then is lifted to a position beneath the front bracket 58 on the front frame member 122, and the long alignment pin 56 is put through bushing 144. When mounting the calibration pallet 60 in this manner, the bushing 186 is directly below the bushing 144 of the front bracket 58. A long alignment pin 56 is inserted through the hole 106 in the front mounting clamp 52 into the alignment bushing in the calibration pallet 60.

As best seen in FIGS. 16, 17 and 18, the printhead 13 has the rear screen holder 196 of an L-like configuration with a horizontal leg 198 on which rests the rear screen frame member 70b. A vertical portion 200 extends upward to form a T-like top end 202 which extends the entire length of the rear screen holder 196 and transverses an opening 208 (FIG. 20) in the vertical portion 200 through which the rear mounting clamp 54 extends.

Slidably mounted on the T top end 202 is a rear bracket 210 having a body 212 which as an inverted T groove 214 on its underside for slidably receiving the T-portion 202 of the rear screen holder 196. More specifically, the body 212 has predominately a rectangular configuration with a top 216 and a bottom 218 wherein the bottom 218 is formed with the inverted T groove 214. On the top 216, a threaded screw 220 having a nylon foot 222 attached thereon extends through the body 212 to form an engagement with the horizontal portion 206 of the rear screen holder 196. The screw 220 is tightened to secure the rear bracket 210 at its calibrated location which is positioned on a radial line between the front bracket 58 and a center point 224 of the central column 9.

Further extending from the rear bracket body 212 is an arm portion 226 having a hole 229 in a bushing 228 extending downward and through which hole 229 the long rear alignment pin 194 is inserted. Having located the front calibration bracket 58 at its aligned position over the hole 189 in the calibration bracket, the rear bracket 210 is slid to the right or to the left with the rear long alignment pin extending down, and when the pin projects into the rear slot 190 in the calibration pallet 60, the screw 220 may be tightened to lock the rear bracket to the rear screen holder 196. Thus, the aperture 229 in the rear bracket is aligned over the slot 190, and the hole in the bushing 144 of the front bracket is aligned over the hole in bushing 186 on the calibration pallet 60, and now the front and rear alignment pins may be removed.

While it is now possible to place the screen frame 50 for the first printing station in the screen holder having its front and rear mounting clamps 52, 54 aligned by and with the calibration pallet, it is preferred to actuate the turntable and index the calibration pallet to the next printing station and the next printhead. At this second printing station, the calibration front and rear brackets 58 and 210 are aligned over the calibration bushing 186 and over the rear slot 190 in the calibration pallet by the long alignment pins. The front and rear brackets are then locked in position as is the bushing 144 on the front bracket 58 so that the hole in this bushing 144 at this second print head is exactly at the same radial distance from the rotational axis of the turntable as the bushing 144 on the front bracket of the first printhead at the first printing station. The alignment pins are removed, and the calibration pallet is indexed to the third printing station.

The alignment process is repeated at each printing station with the result that the bushings 144 on the front brackets at each station are precisely at the same radial distance from the rotational axis. Because the circumferential is usually one increment of travel or indexing movement by the indexer of the pallet turntable, each of the bushings 144 will be located exactly at the same distance from its adjacent bushings at adjacent printing stations. If there are eight printing stations with eight bushings 144 on eight printheads, each bushing will be located at an arc length of one eight of the circumference of a circle, defined by the bushings, from its neighboring bushings at the neighboring printing stations.

The rear holes 229 in the rear brackets 210 are also located at the same radial distance from the rotational axis at each of the printing stations. The holes in the front bushing 144 on the front bracket 58 and the holes on the rear bracket define a line that will be superimposed on a radius extending from the rotational axis. The rotational line was defined originally by an underlying radial line extending from the center of the hole 186 in the calibration pallet 60 through the center of the slot 190 in the calibration pallet 60.

The screen frames 50 may now be brought to their respective printing stations and placed on the front and screen holders at each printing station. A front alignment pin is inserted through the bushing 144 in the screen holder bracket 58 and dropped down to the underlying front clamp 52 on the screen frame 50. The screen frame 50 is shifted until the front alignment pin 56 drops into the hole 106 in the front clamp 52. A rear alignment pin 194 is inserted through hole 229 in the rear bracket, and the rear of the screen frame 50 is pivoted about the front alignment pin 58 until the nose of the rear alignment pin drops in the slot 108 on the rear clamp 54 fixed to the rear screen frame member 70b. The screen frame now is precisely registered and needs to be secured tightly in the its screen holder. A plurality of clamps 230 are provided on the front screen holder 124, as shown in FIG. 1, and the rear screen holder 196. The clamps 230 are used to secure the screen frame in place after registration. After the screen frame 50 is secured in place the long alignment pins 56, 194 are removed. The registration procedure is continued until all the screen frames are registered in their respective printhead. As one can see, this method insures that all the registrations are done accurately, thereby placing each screen frame in their printhead at the same location which respect to each other. Thus, all the screen frames should be registered precisely when the machine is static, non-operating.

The illustrated printing machine is provided with micro adjustment means 232 for making minor adjustments to compensate for the dynamic operation of the printing machine 10. The micro adjusting of the screen frame 50 is theoretically moving the image to compensate for the dynamics of the printing machine 10. If all of the screens are tight, and the pressure of the squeegees are similar, then the screens should be deflected about the same extent. However, if some screens deflect more than others, then there may be some misalignment of the images. By moving the micro-adjustment means on this conventional printing press, the images may be more precisely registered. This dynamic operation includes factors such as varying tension of the screen material and strength of the screen frames along with weight of the ink and many other variables. Overall, this method for registering screen frames allows for easier, quicker and extremely accurate registration images on screens used in a multi-color screen printer.

An additional advantage to this system is that the system registers, as accurately as the traditional rectangular screen frames, screen frames of any shape. Further, the image does not have to be on the screen in any particular position.

Since the resulting pins are removable the screen frames are easily replaced back in the printing machine after being removed for cleaning or maintenance. After being replaced, only the micro adjustments may be necessary which is an advantageous time saving result.

The screen printing apparatus described herein is a turret type rotary screen printer. Manifestly, the same method of registration could be used with other screen printers, e.g. a so called oval screen printing machine in which the pallets are conveyed by a conveyor mechanism in an oval endless path through the various printing stations.

The pallet carrier herein described is provided with the removable calibration pallet with the calibration means thereon in the form of holes and slots. It is contemplated that the calibration means could be permanently provided as part of a permanent pallet arm on the turntable rather than as a separate removable item. Also, rather than adding clamps to screen frames to provide the portions of the screen frame for registering with pins 26, 28 on the vacuum table and the front and rear alignment pins 56, 194, the screen frames themselves may have a permanent portion thereon provided with holes to receive alignment pins 26, 28 and 56, 194.

The front and rear calibration members on the printing heads herein illustrated have been termed front and rear calibration brackets because of the particular form the calibration members are shown in; but these calibration members may take other forms which are so called "brackets" and fall within the preview of this invention. The printing heads herein are supported by the central column of the rotary printing machine above the pallet arms and are part of the same machine. In other instances, the printing heads are separately standing printing heads not supported on the central column and are separate units. It is possible to register the printing heads of these separate units using the system and method herein described.

While the preferred embodiment has been shown and described, it will be understood that there is no intent to limit the invention by such disclosure; but rather it is intended to cover all modifications and alternative constructions falling within the spirit and the scope of the pended claims.

What is claimed is:

1. A method for registration of a plurality of images on screens on screen frames in a screen printer having a succession of screen printing stations at which are located printing heads for printing successive images on a workpiece carried by a pallet carrier through the successive printing stations, said method comprising the steps of:

provide a support for securing each of the screens to one of a plurality of image positives;

positioning each of the image positives on the support relative to a first and second registration means on the support so that each image positive is registered with respect to the first and second registration means;

bringing each of the screen frames in succession to the support and registering a registration portion of each screen frame with the first and second registration means on the support;

securing each of the screen frames on the support in a position where the image positives and the registration portions of the screen frames are in a known fixed relationship to one another;

exposing the image positives while on the screen frames to provide an image on each screen frame;

providing a calibration means on the pallet carrier of the screen printer having first and second portions located at positions corresponding to the registration portions on the screen frames;

positioning the calibration means on the pallet carrier at a first printing station and adjusting first and second calibration members on the printing head into aligned positions with the first and second portions of the calibration means;

advancing the calibration means and the pallet carrier through its normal printing advancement to the next printing station and adjusting the first and second calibration members on the printing head at the second printing station into alignment with the first and second portions of the calibration means;

bringing each of the screen frames to its respective printing station and aligning the registration portions on each screen frame with the first and second calibration members on the respective printing heads that have been previously aligned by the calibration means on the pallet carrier; and securing the screen frames to the printing heads after such alignment.

2. A method in accordance with claim 1 in which the screen printer is a rotary screen printer and in which advancing of the pallet carrier includes indexing the pallet carrier through an arcuate path of travel and in which the step of adjusting the first calibration member on the printing heads causes each calibration member to be respectively the same radial distance from the center of rotation of the pallet carrier.

3. A method in accordance with claim 1 in which the step of aligning the registration portions on the screen frames with the first and second calibration members on the printing head includes the step of inserting an aligning pin through holes in the respective screen frame registration members and calibration members on the printing heads.

4. A method in accordance with claim 3 in which aligning pins are inserted in front holes at radially outward positions on the printing head and screen frames.

5. A method in accordance with claim 1 in which the step of positioning each of the image positives on the support includes having holes in the image positives and affixing pin tabs on the support and projecting pins on the pin tabs through the holes in the image positives.

6. A method in accordance with claim 5 in which the step of positioning each of the image positives on the support includes the step of locating the image positive on a vacuum table support at a location with one end of the image positive located at a distance from the first registration means in the form of a pin at a distance related to a distance at which a squeegee stroke will begin on the image when on the screen and includes generally centering the image positive on a line between the first pin registration means and a second pin registration means.

7. A method in accordance with claim 6 in which the registration portion on the screen frame are registration clamps secured substantially in the center of the front and rear ends of the screen frame having apertures in the clamps and including the steps of inserting the registration pins on the vacuum table support through the apertures on the registration clamps.

8. A method in accordance with claim 7 in which adjustable brackets on the printing heads support the calibration members and including the steps of moving the adjustable brackets and inserting pins through holes in the adjustable brackets and into the holes in the registration clamps on the screen frame and then into holes in the carrier pallet.

9. A method of registering each of a plurality of images each on a screen positive on a plurality of screens in a screen printing apparatus having a plurality of screen printing heads with screen holders for supporting screen frames over a moveable pallet carrying a workpiece from station to station for printing each of the images in registry, the method comprising:

providing a support for the screen positive having holes therein and inserting pins into the holes to locate the screen positive on the support and relative to a registration means on the support;

fixing the pins in this position so that subsequent images on subsequent screen positive may be positioned on the pins and have the same location relative to the registration means on the support;

providing registration means on the screen frame and aligning the registration means with the registration means on the support;

superimposing the aligned screen frame onto a screen positive and securing the screen positive to the aligned screen frame;

exposing each screen positive onto the screen;

placing each screen frame and its associated registration means on the screen holder of the printing apparatus;

providing a precisely located first alignment means on a pallet support and positioning each of the screen frames in a screen holder and aligning the registration means on the screen frames with a second alignment means on each of the screen holders;

positioning the pallet support beneath the alignment means on the screen holder and aligning the alignment means on the screen holder with the alignment means on the pallet support at each of the printing stations; and fixing each of the screen frames to the screen holders after having been aligned with the alignment means of the screen holder.

10. A method in accordance with claim 9 in which the steps of aligning the screen frame with the alignment means on the screen holder includes inserting pins through holes in the alignment means on the screen holder and the registration means on the screen frames.

11. A method in accordance with claim 10 in which the pins include front and rear pins which are projected through the holes on the respective alignment and registration means on the front and rear of the screen holder and the screen frame.

12. A method in accordance with claim 11 in which the front and rear pins are removed at each station prior to printing and in which the pallet support is indexed from station to station to receive the front and rear pins at each printing station.

13. A method in accordance with claim 9 in which the support is a vacuum table and in which the registration means on the support includes projecting pins secured to the vacuum table and including the step of positioning holes in the registration means on the screen frames onto the projecting pins.

14. In a screen printing system, a registration apparatus for registering a plurality of screen positive having images thereon which need to be accurately positioned to print a desired impression, comprising:
- a first registration means on a vacuum table;
- a second registration means includes pins to register with holes in each screen positive at a specific location on the vacuum table with respect to the first registration means;
- at least one first alignment member secured to a screen frame and registered on the first registration means to position the alignment member on the screen frame at an exact location relative to the screen positive;
- means to secure the screen positive to the screen frame with the screen positive and the first alignment member positioned precisely to each other and the first registration means;
- a screen printing apparatus having a moveable platen with a second alignment member thereon, a screen holder on a printing head having a third alignment member for supporting the screen frame;
- an alignment means for aligning the first alignment member on the screen frame with the third alignment member on the screen holder and the second alignment member of the platen; and
- means to fix each of the screen frames in its adjusted and aligned position on its respective screen holder.

15. A system in accordance with claim 14 in which the platen is a removable registration pallet and in which the alignment members have holes therein which are moved along on the front and rear ends of the screen holder and in which the alignment means includes long pins to extend through holes in the front and rear ends of the screen holder, screen frame and removable pallet.

16. An alignment apparatus to align a screen frame used in a screen printing apparatus comprising:
- a screen printing apparatus for printing multiple images in a predetermined sequence upon a given pallet, wherein a plurality of successive printing stations each containing a printhead are disposed in a sequential array and a plurality of pallet arms each carrying a printing surface are indexed from printing station to printing station;
- a screen holder located at each printing station;
- a screen frame for holding a screen with an image thereon having at least one mount clamp fixed in a precise location on the screen frame relative to the image;
- an upper alignment means on the screen holder;
- a lower alignment means on at least one of said pallet arms;
- alignment pins to align the mount clamp of the screen frame with the upper alignment means on the screen holder and to align the upper screen holder alignment means with the lower alignment means on the pallet arm to position the screen frame at a predetermined location with respect to the screen holder;
- the lower alignment means on the pallet arm being indexed from printhead to printhead to bring the upper alignment means on each printhead at a fixed radial distance from an axis of rotation and at an equal increment of rotational travel;
- means to fix each screen frame in its aligned position on a screen holder; and
- a micro adjust means to move the screen holder and screen frame thereon.

* * * * *